US012784786B2

(12) United States Patent
Lin et al.

(10) Patent No.: US 12,784,786 B2
(45) Date of Patent: Nov. 3, 2026

(54) THREE-DIMENSIONAL MEMORY DEVICE, COMPUTING CIRCUIT AND COMPUTING METHOD

(71) Applicant: MACRONIX INTERNATIONAL CO., LTD., Hsinchu (TW)

(72) Inventors: Yu-Hsuan Lin, Taichung City (TW); Feng-Min Lee, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 227 days.

(21) Appl. No.: 18/435,006

(22) Filed: Feb. 7, 2024

(65) Prior Publication Data

US 2025/0252981 A1 Aug. 7, 2025

(51) Int. Cl.
*G11C 7/10* (2006.01)

(52) U.S. Cl.
CPC .......... *G11C 7/1069* (2013.01); *G11C 7/1039* (2013.01); *G11C 7/109* (2013.01)

(58) Field of Classification Search
CPC ........................................................ G06N 3/06
See application file for complete search history.

(56) References Cited

U.S. PATENT DOCUMENTS 10,552,510 B2 2/2020 Bayat
10,825,510 B2 11/2020 Jaiswal
11,094,376 B2 8/2021 Grover
2012/0170361 A1* 7/2012 Ranjan .................. G11C 11/161 365/171
2021/0173893 A1* 6/2021 Luo ......................... G06F 17/16

(Continued)

FOREIGN PATENT DOCUMENTS

CN 114388039 A 4/2022
TW I704569 B 9/2020
TW 202341150 A 10/2023

OTHER PUBLICATIONS

N. Lepri et al., "Mitigating read-program variation and IR drop by circuit architecture in RRAM-based neural network accelerators," 2022 IEEE International Reliability Physics Symposium (IRPS), Dallas, TX, USA, 2022, pp. 3C.2-1-3C.2-6, doi: 10.1109/IRPS48227.2022.9764486.

*Primary Examiner* — Douglas King
(74) *Attorney, Agent, or Firm* — McClure, Qualey & Rodack, LLP

(57) ABSTRACT

A three-dimensional (3D) memory device comprising a 3D memory array, an encoding circuit, a sensing circuit and a processing circuit is provided in present disclosure. The 3D memory array comprises multiple two-dimensional (2D) memory arrays and is configured to receive multiple input voltages and output multiple output currents. Each 2D memory array comprises multiple memory cells and a four-array-side edge. The encoding circuit and the sensing circuit are coupled to the processing circuit and the four-array-side edge, and respectively configured to input the input voltages and receive the output currents. The processing circuit is configured to perform an in-memory-computing according to the input voltages and the output currents. The four-array-side edge has multiple array sides. When one of the array sides is configured to receive the input voltages, another is configured to output the output currents, wherein the one of the array sides is not parallel to the another.

20 Claims, 9 Drawing Sheets

(56) References Cited

U.S. PATENT DOCUMENTS

| | | | | |
|---|---|---|---|---|
| 2021/0397931 | A1* | 12/2021 | Hoang | G06N 3/044 |
| 2022/0398439 | A1* | 12/2022 | Zhang | G06N 3/063 |
| 2023/0395143 | A1 | 12/2023 | Chen | |
| 2024/0071456 | A1* | 2/2024 | Kim | G11C 11/2273 |
| 2024/0202275 | A1* | 6/2024 | Burr | G06F 17/16 |
| 2025/0231863 | A1* | 7/2025 | Lai | G06F 7/5443 |

* cited by examiner

THREE-DIMENSIONAL MEMORY DEVICE, COMPUTING CIRCUIT AND COMPUTING METHOD

BACKGROUND

Technical Field

The present disclosure is related to the in-memory-computing technology for three-dimensional memory device. More particularly, the present disclosure is related to a three-dimensional memory device, a computing circuit and a computing method performing the in-memory-computing by utilizing input voltages and output currents in different directions of the three-dimensional memory device.

Description of Related Art

With the development of memory technology and the required function for large amount of computing, three-dimensional (3D) memory device has gradually replaced traditional planar memory due to its lower unit cost. In addition, in order to alleviate the condition that the processor needs to spend a lot of time and energy to read data from the memory, the in-memory computing technology has gradually attracted attention. With the in-memory computing technology, computations can be directly performed in the memory, so as to enhance the speed and efficiency of reading data.

The memory array in the 3D memory device has a large amount of memory cells, and each of the memory cells has corresponding conductance. The in-memory computing is performed by inputting voltages to the memory array and sensing outputted currents from the memory array. However, in the past in-memory-computing methods, the voltage drop on the wires inside the memory array is not considered, which resulted in inaccurate computing results. In addition, larger memory array will lead to larger computing errors. In order to eliminate the error of computing caused by the voltage drop on the wire, a method to perform the in-memory-computing with multiple matrices is developed.

However, using multiple matrices to perform computing will greatly increase the amount of computing of the in-memory-computing, and the improvement for the aforementioned condition is still not ideal. Consequently, how to effectively alleviate the error of in-memory-computing caused by the voltage drop on the wire is one of the topics in this field.

SUMMARY

A three-dimensional (3D) memory device is provided in present disclosure. The 3D memory device comprises a 3D memory array, an encoding circuit, a sensing circuit and a processing circuit. The 3D memory array comprises a plurality of two-dimensional (2D) memory arrays and is configured to receive a plurality of input voltages and output a plurality of output currents. Each of the plurality of 2D memory arrays comprises a plurality of memory cells and comprises a four-array-side edge. The encoding circuit is coupled to the four-array-side edge and configured to input the plurality of input voltages to the plurality of 2D memory arrays. The sensing circuit is coupled to the four-array-side edge and configured to receive the plurality of output currents from the plurality of 2D memory arrays. The processing circuit is coupled to the encoding circuit and the sensing circuit, and is configured to perform an in-memory-computing according to the plurality of input voltages and the plurality of output currents. The four-array-side edge has a plurality of array sides. When one of the plurality of array sides is configured to receive the plurality of input voltages, another of the plurality of array sides is configured to output the plurality of output currents, wherein the one of the plurality of array sides is not parallel to the another of the plurality of array sides.

In some embodiments of the 3D memory device, the encoding circuit comprises a first encoding circuit and a second encoding circuit. The first encoding circuit and the second encoding circuit are configured to input the plurality of input voltages to the plurality of 2D memory arrays respectively through a first array side and a second array side of the plurality of array sides. The first array side is parallel to and different from the second array side.

In some embodiments of the 3D memory device, the sensing circuit comprises a first sensing circuit and a second sensing circuit. The first sensing circuit and the second sensing circuit are configured to receive the plurality of output currents from the plurality of 2D memory arrays respectively through a first array side and a second array side of the plurality of array sides. The first array side is parallel to and different from the second array side.

In some embodiments of the 3D memory device, the encoding circuit comprises a first encoding circuit and a second encoding circuit, and the sensing circuit comprises a first sensing circuit and a second sensing circuit. The first encoding circuit and the second encoding circuit are configured to input the plurality of input voltages to the plurality of 2D memory arrays respectively through a first array side and a second array side of the plurality of array sides. The first sensing circuit and the second sensing circuit are configured to receive the plurality of output currents from the plurality of 2D memory arrays respectively through a third array side and a fourth array side of the plurality of array sides. The first array side is parallel to and different from the second array side, and the third array side is parallel to and different from the fourth array side.

In some embodiments of the 3D memory device, the encoding circuit comprises a first encoding circuit and a second encoding circuit, and the sensing circuit comprises a first sensing circuit and a second sensing circuit. The first encoding circuit is configured to input a plurality of first input voltages to the plurality of 2D memory arrays through a first array side of the plurality of array sides, and the second encoding circuit is configured to input a plurality of second input voltages to the plurality of 2D memory arrays through a second array side of the plurality of array sides. The first sensing circuit is configured to receive a plurality of first output currents from the plurality of 2D memory arrays through a third array side of the plurality of array sides, and the second sensing circuit is configured to receive a plurality of second output currents from the plurality of 2D memory arrays through a fourth array side of the plurality of array sides. The first array side is not parallel to the second array side, the third array side is not parallel to the fourth array side, and the plurality of first input voltages are different from the plurality of second input voltages.

In some embodiments of the 3D memory device, the encoding circuit comprises four sub-encoding circuits, and the sensing circuit comprises four sub-sensing circuits. The four sub-encoding circuits are respectively coupled to the plurality of array sides of the each of the plurality of 2D memory arrays, and the four sub-sensing circuits are respectively coupled to the plurality of array sides of the each of the plurality of 2D memory arrays. When one of the four sub-encoding circuits inputs the plurality of input voltages to the plurality of 2D memory arrays, one of the four sub-sensing circuits is configured to receive the plurality of output currents from the plurality of 2D memory arrays. The array side that the one of the four sub-encoding circuits is coupled to is not parallel to the array side that the one of the four sub-sensing circuits is coupled to.

In some embodiments of the 3D memory device, the processing circuit is further configured to control the one of the four sub-encoding circuits and the one of the four sub-sensing circuits to conduct to the 3D memory array, and control the other three of the four sub-encoding circuits and the other three of the four sub-sensing circuits to electrically disconnect from the 3D memory array.

A computing circuit is provided in the present disclosure. The computing circuit is coupled to a 3D memory array comprising a plurality of 2D memory arrays, and each of the plurality of 2D memory arrays comprises a four-array-side edge. The computing circuit comprises an encoding circuit, a sensing circuit and a processing circuit. The encoding circuit is coupled to the four-array-side edge and configured to input a plurality of input voltages to the plurality of 2D memory arrays. The sensing circuit is coupled to the four-array-side edge and configured to receive a plurality of output currents from the plurality of 2D memory arrays. The processing circuit is coupled to the encoding circuit and the sensing circuit, and is configured to perform an in-memory-computing according to the plurality of input voltages and the plurality of output currents. The four-array-side edge has a plurality of array sides. When the encoding circuit inputs the plurality of input voltages to one of the plurality of array sides, the sensing circuit receives the plurality of output currents from another of the plurality of array sides, and the one of the plurality of array sides is not parallel to the another of the plurality of array sides.

In some embodiments of the computing circuit, the encoding circuit comprises a first encoding circuit and a second encoding circuit. The first encoding circuit and the second encoding circuit are configured to input the plurality of input voltages to the plurality of 2D memory arrays respectively through a first array side and a second array side of the plurality of array sides. The first array side is parallel to and different from the second array side.

In some embodiments of the computing circuit, the sensing circuit comprises a first sensing circuit and a second sensing circuit. The first sensing circuit and the second sensing circuit are configured to receive the plurality of output currents from the plurality of 2D memory arrays respectively through a first array side and a second array side of the plurality of array sides. The first array side is parallel to and different from the second array side.

In some embodiments of the computing circuit, the encoding circuit comprises a first encoding circuit and a second encoding circuit, and the sensing circuit comprises a first sensing circuit and a second sensing circuit. The first encoding circuit and the second encoding circuit are configured to input the plurality of input voltages to the plurality of 2D memory arrays respectively through a first array side and a second array side of the plurality of array sides. The first sensing circuit and the second sensing circuit are configured to receive the plurality of output currents from the plurality of 2D memory arrays respectively through a third array side and a fourth array side of the plurality of array sides. The first array side is parallel to and different from the second array side, and the third array side is parallel to and different from the fourth array side.

In some embodiments of the computing circuit, the encoding circuit comprises a first encoding circuit and a second encoding circuit, and the sensing circuit comprises a first sensing circuit and a second sensing circuit. The first encoding circuit is configured to input a plurality of first input voltages to the plurality of 2D memory arrays through a first array side of the plurality of array sides, and the second encoding circuit is configured to input a plurality of second input voltages to the plurality of 2D memory arrays through a second array side of the plurality of array sides. The first sensing circuit is configured to receive a plurality of first output currents from the plurality of 2D memory arrays through a third array side of the plurality of array sides, and the second sensing circuit is configured to receive a plurality of second output currents from the plurality of 2D memory arrays through a fourth array side of the plurality of array sides. The first array side is not parallel to the second array side, the third array side is not parallel to the fourth array side, and the plurality of first input voltages are different from the plurality of second input voltages.

In some embodiments of the computing circuit, the encoding circuit comprises four sub-encoding circuits, and the sensing circuit comprises four sub-sensing circuits. The four sub-encoding circuits are respectively coupled to the plurality of array sides of the each of the plurality of 2D memory arrays, and the four sub-sensing circuits are respectively coupled to the plurality of array sides of the each of the plurality of 2D memory arrays. When one of the four sub-encoding circuits inputs the plurality of input voltages to the plurality of 2D memory arrays, one of the four sub-sensing circuits is configured to receive the plurality of output currents from the plurality of 2D memory arrays. The array side that the one of the four sub-encoding circuits is coupled to is not parallel to the array side that the one of the four sub-sensing circuits is coupled to.

In some embodiments of the computing circuit, the processing circuit is further configured to control the one of the four sub-encoding circuits and the one of the four sub-sensing circuits to conduct to the 3D memory array, and control the other three of the four sub-encoding circuits and the other three of the four sub-sensing circuits to electrically disconnect from the 3D memory array.

A computing method suitable for a 3D memory device is provided in the present disclosure. The 3D memory device comprises a 3D memory array, an encoding circuit, a sensing circuit and a processing circuit, and the 3D memory array comprises a plurality of 2D memory arrays. The computing method comprises: inputting, by the encoding circuit, a plurality of input voltages to the plurality of 2D memory arrays; receiving, by the sensing circuit, a plurality of output currents from the plurality of 2D memory arrays; and performing, by the processing circuit, an in-memory-computing according to the plurality of input voltages and the plurality of output currents. Each of the plurality of 2D memory arrays comprises a four-array-side edge having a plurality of array sides. When one of the plurality of array sides is configured to receive the plurality of input voltages, another of the plurality of array sides is configured to output the plurality of output currents, and the one of the plurality of array sides is not parallel to the another of the plurality of array sides.

In some embodiments of the computing method, inputting, by the encoding circuit, the plurality of input voltages to the plurality of 2D memory arrays comprises: inputting, by a first encoding circuit of the encoding circuit, the plurality of input voltages to the plurality of 2D memory arrays through a first array side of the plurality of array sides; and inputting, by a second encoding circuit of the encoding circuit, the plurality of input voltages to the plurality of 2D memory arrays through a second array side of the plurality of array sides. The first array side is parallel to and different from the second array side.

In some embodiments of the computing method, receiving, by the sensing circuit, the plurality of output currents from the plurality of 2D memory arrays comprises: receiving, by a first sensing circuit of the sensing circuit, the plurality of output currents from the plurality of 2D memory arrays through a first array side of the plurality of array sides; and receiving, by a second sensing circuit of the sensing circuit, the plurality of output currents from the plurality of 2D memory arrays through a second array side of the plurality of array sides. The first array side is parallel to and different from the second array side.

In some embodiments of the computing method, inputting, by the encoding circuit, the plurality of input voltages to the plurality of 2D memory arrays comprises: inputting, by a first encoding circuit of the encoding circuit, the plurality of input voltages to the plurality of 2D memory arrays through a first array side of the plurality of array sides; and inputting, by a second encoding circuit of the encoding circuit, the plurality of input voltages to the plurality of 2D memory arrays through a second array side of the plurality of array sides. Receiving, by the sensing circuit, the plurality of output currents from the plurality of 2D memory arrays comprises: receiving, by a first sensing circuit of the sensing circuit, the plurality of output currents from the plurality of 2D memory arrays through a third array side of the plurality of array sides; and receiving, by a second sensing circuit of the sensing circuit, the plurality of output currents from the plurality of 2D memory arrays through a fourth array side of the plurality of array sides. The first array side is parallel to and different from the second array side, and the third array side is parallel to and different from the fourth array side.

In some embodiments of the computing method, inputting, by the encoding circuit, the plurality of input voltages to the plurality of 2D memory arrays comprises: inputting, by a first encoding circuit of the encoding circuit, a plurality of first input voltages to the plurality of 2D memory arrays through a first array side of the plurality of array sides; and inputting, by a second encoding circuit of the encoding circuit, a plurality of second input voltages to the plurality of 2D memory arrays through a second array side of the plurality of array sides. Receiving, by the sensing circuit, the plurality of output currents from the plurality of 2D memory arrays comprises: receiving, by a first sensing circuit of the sensing circuit, a plurality of first output currents from the plurality of 2D memory arrays through a third array side of the plurality of array sides; and receiving, by a second sensing circuit of the sensing circuit, a plurality of second output currents from the plurality of 2D memory arrays through a fourth array side of the plurality of array sides. The first array side is not parallel to the second array side, the third array side is not parallel to the fourth array side, and the plurality of first input voltages are different from the plurality of second input voltages.

In some embodiments of the computing method, the encoding circuit comprises four sub-encoding circuits respectively coupled to the plurality of array sides of the each of the plurality of 2D memory arrays, and the sensing circuit comprises four sub-sensing circuits respectively coupled to the plurality of array sides of the each of the plurality of 2D memory arrays. Inputting, by the encoding circuit, the plurality of input voltages to the plurality of 2D memory arrays comprises: inputting, by one of the four sub-encoding circuits, the plurality of input voltages to the plurality of 2D memory arrays. Receiving, by the sensing circuit, the plurality of output currents from the plurality of 2D memory arrays comprises: receiving, by one of the four sub-sensing circuits, the plurality of output currents from the plurality of 2D memory arrays. The array side that the one of the four sub-encoding circuits is coupled to is not parallel to the array side that the one of the four sub-sensing circuits is coupled to.

With the 3D memory device, the computing circuit and the computing method disclosed in the present disclosure, the in-memory-computing can be performed by using a plurality of input voltages and a plurality of output currents, so as to alleviate the effect of the voltage drop on the wires inside the memory array on computing, thereby improving the accuracy of the in-memory-computing.

It should be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings.

In the present disclosure, when an element is referred to as "connected", it may mean "electrically connected" or "optical connected". When an element is referred to as "coupled", it may mean "electrically coupled" or "optical coupled". "Connected" or "coupled" can also be used to indicate that two or more components operate or interact with each other. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Figure 1:
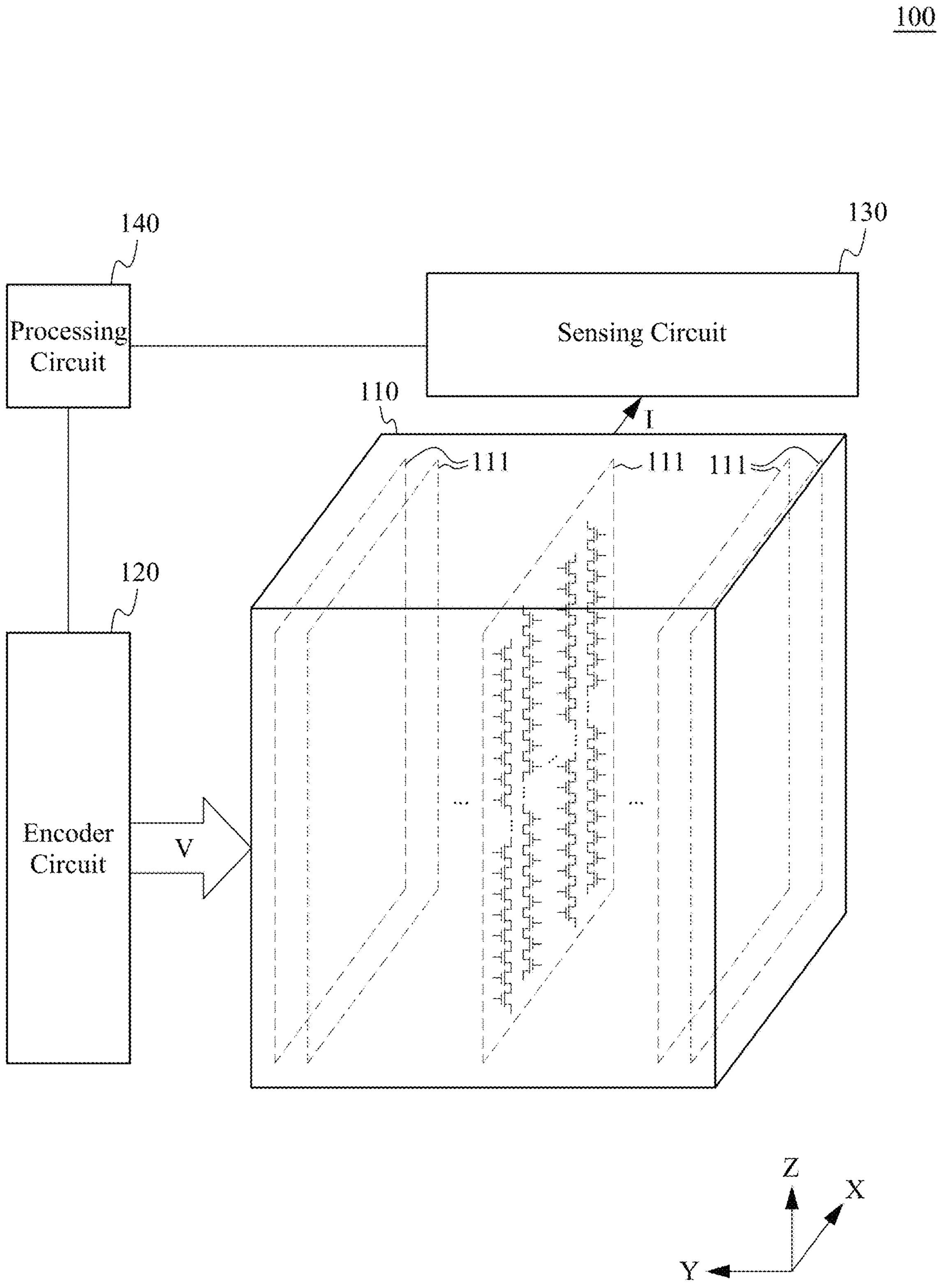
FIG. 1 is a three-dimensional (3D) schematic diagram of a 3D memory device in accordance with some embodiments of the present disclosure.

FIG. 1 is a three-dimensional (3D) schematic diagram of a 3D memory device 100 in accordance with some embodiments of the present disclosure. In some embodiments, the 3D memory device 100 comprises a 3D memory array 110, an encoding circuit 120, a sensing circuit 130 and a processing circuit 140.

The 3D memory array 110 is coupled between the encoding circuit 120 and the sensing circuit 130, and is configured to receive input voltages V from the encoding circuit 120 and transmit output currents I to the sensing circuit 130. In some embodiments, the 3D memory array 110 comprises a plurality of two-dimensional (2D) memory arrays 111. The planes of these 2D memory arrays 111 extend along a plane direction (e.g., the plane direction formed by the directions X and Z in FIG. 1), and these 2D memory arrays 111 are arranged along another specific direction (e.g., the direction Y in FIG. 1), so as to jointly form a 3D structure.

In some embodiments, the 3D memory array 110 may be implemented with a volatile memory (e.g., a dynamic random access memory (DRAM), a static random access memory (SRAM)), a non-volatile memory (e.g., a magnetoresistive random access memory (MRAM), a ferroelectric random access memory (FeRAM)) or a combination of the above elements.

In some embodiments, each 2D memory array 111 comprises a plurality of memory cells (e.g., a plurality of transistors illustrated in FIG. 1). The internal structure of these memory cells will be described in detail in following paragraphs.

The encoding circuit 120 is coupled to the plurality of 2D memory arrays 111 in the 3D memory array 110 and the processing circuit 140, and is configured to input the input voltages V to the plurality of 2D memory arrays 111, so as to facilitate the processing circuit 140 to perform an in-memory-computing.

The sensing circuit 130 is coupled to the plurality of 2D memory arrays 111 in the 3D memory array 110 and the processing circuit 140, and is configured to receive the output currents I from the plurality of 2D memory arrays 111, so as to facilitate the processing circuit 140 to perform the in-memory-computing.

The processing circuit 140 is coupled to the encoding circuit 120 and the sensing circuit 130, and is configured to perform the in-memory-computing on the 3D memory array 110 based on the input voltages V and the output currents I.

Figure 2A:
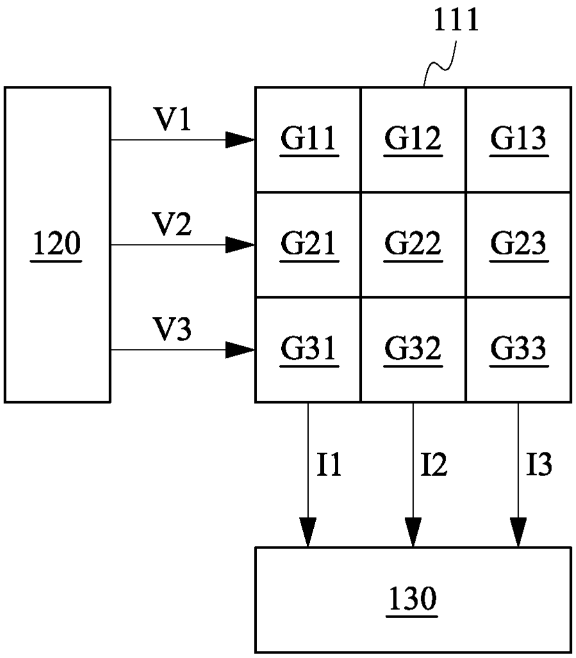
FIG. 2A is a schematic diagram of an encoding circuit, a sensing circuit and a two-dimensional (2D) memory array in accordance with some examples.

Since each 2D memory array 111 is coupled to the encoding circuit 120 and the sensing circuit 130 in a similar manner, for the sake of brevity, the connection relationship between only one of the plurality of 2D memory arrays 111 and the encoding circuit 120 and the sensing circuit 130 will be described below. FIG. 2A is a schematic diagram of the encoding circuit 120, the sensing circuit 130 and a 2D memory array 111 in accordance with some examples. In some embodiments, the 2D memory array 111 comprises memory cells G11-G13, G21-G23 and G31-G33, and the memory cells G11-G13, G21-G23 and G31-G33 are arranged in a square array with three columns and three rows. Therefore, the 2D memory array 111 is a square array having a four-array-side edge, wherein the four-array-side edge has a plurality of array sides. In other words, the 2D memory array 111 comprises an array side formed by memory cells G11-G13, an array side formed by memory cells G31-G33, an array side formed by memory cells G11, G21 and G31, and an array side formed by memory cells G13, G23 and G33.

It should be noted that for the sake of brevity of the diagram, the 2D memory array 111 is illustrated in FIG. 2A as an array having three columns and three rows and comprising nine memory cells. However, the example in FIG. 2A is only an example, and is not intended to limit the present disclosure. Other numbers of memory cells are within the scope of the present disclosure. In some embodiments, the 2D memory array 111 can be an array having 256 columns and 256 rows and comprising 65536 memory cells.

Figure 2B:
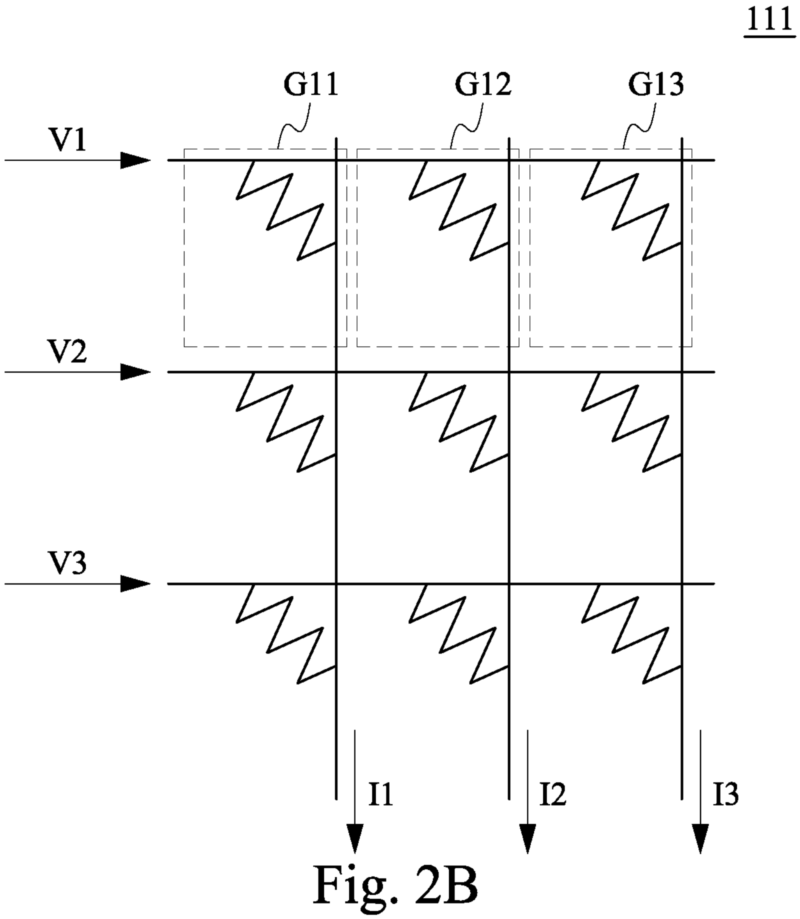
FIG. 2B is a circuit diagram of a 2D memory array in accordance with some embodiments of the present disclosure.
Figure 2C:
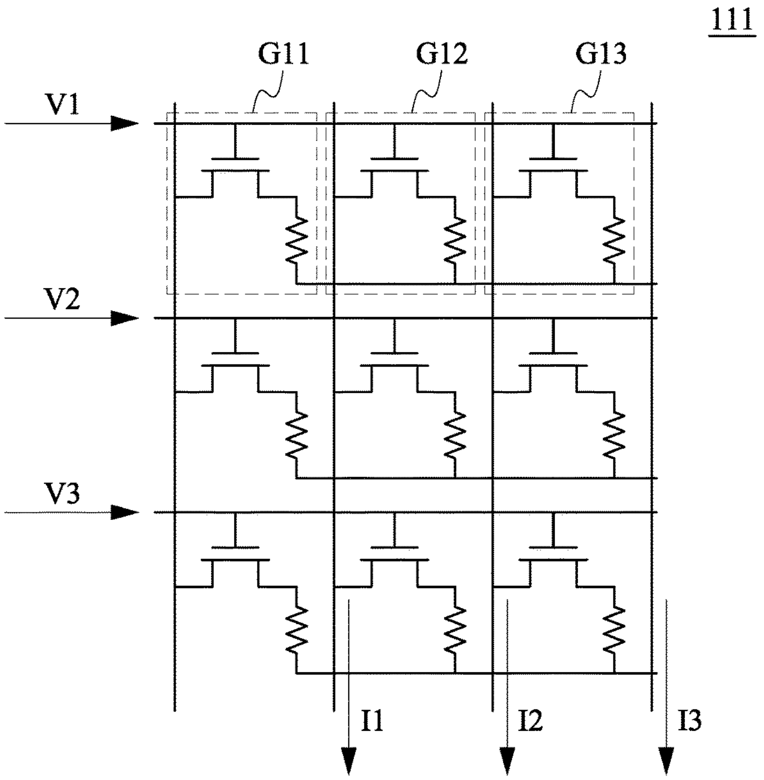
FIG. 2C is a circuit diagram of a 2D memory array in accordance with other embodiments of the present disclosure.
Figure 2D:
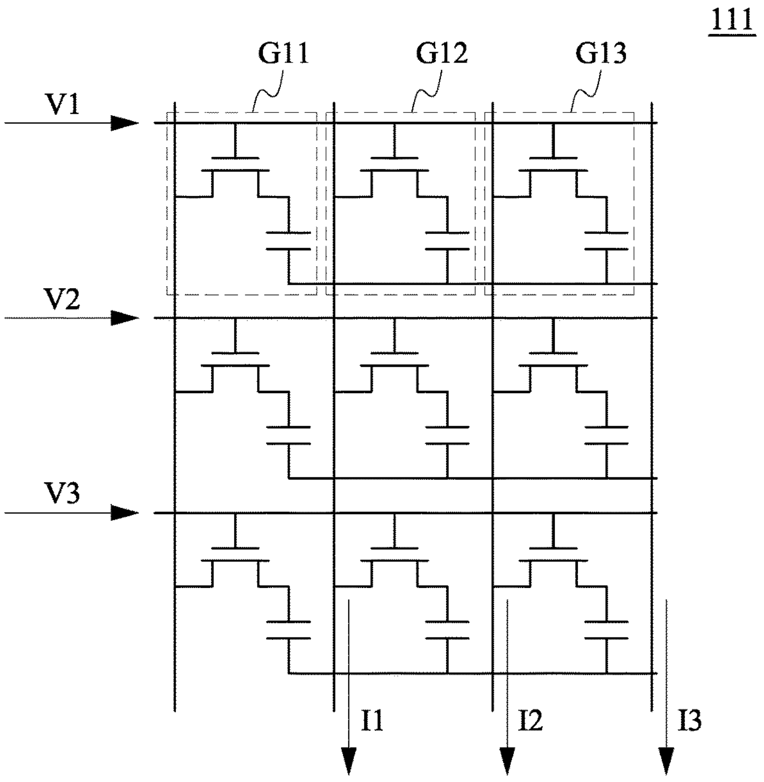
FIG. 2D is a circuit diagram of a 2D memory array in accordance with yet other embodiments of the present disclosure.

For the implementation of the memory cells G11-G13, G21-G23 and G31-G33, please refer to FIGS. 2B-2D. FIGS. 2B-2D are circuit diagrams of the 2D memory array 111 in accordance with various embodiments of the present disclosure.

In some embodiments, the memory cells G11-G13, G21-G23 and G31-G33 can be connected by horizontal and vertical wires, so as to form a cross-point type array. For example, in the embodiment of FIG. 2B, the memory cells G11-G13 and the memory cells G21-G23 and G31-G33 (not labeled for the sake of brevity) are respectively coupled to adjacent memory cells through the horizontal and vertical wires, and each of the memory cells (i.e., each cross point of the cross-point type array) is implemented with a circuit comprising a resistor.

In other embodiments, the memory cells G11-G13, G21-G23 and G31-G33 can also be connected by horizontal and vertical wires, and can further control their conduction status through word lines, so as to form a NOR type array. For example, in the embodiment of FIG. 2C, the memory cells G11-G13 and the memory cells G21-G23 and G31-G33 (not labeled for the sake of brevity) are respectively coupled to adjacent memory cells through the horizontal and vertical wires, and each of the memory cells is implemented with a circuit comprising a resistor and a capacitor. In addition, the control terminals of memory cells on the same row of the memory array are connected to a word line.

Similar to FIG. 2C, in the embodiment of FIG. 2D, the memory cells G11-G13, G21-G23 and G31-G33 also form a NOR type array. The difference is that each memory cell in FIG. 2D is implemented with a circuit comprising an inductor and a capacitor.

It should be noted that the implementations of the memory cells G11-G13, G21-G23 and G31-G33 in FIGS. 2B-2D are only examples, and are not intended to limit the present disclosure. As long as the circuit structures of the memory cells meet the conditions of cross-point type array or NOR type array, other implementations of memory cells are within the scope of the present disclosure.

Please refer to FIG. 2A again. The example shown in FIG. 2A is often implemented as a common circuit connection method. In detail, in the 3D memory device 100, the encoding circuit 120 is connected to one of the array sides of the 2D memory array 111, and the sensing circuit 130 is connected to another of the array sides of the 2D memory array 111. Take the embodiment in FIG. 2A as example, the encoding circuit 120 is connected to the left array side of the 2D memory array 111 to respectively transmit input voltages V1-V3 to the memory cells G11, G21 and G31, and the sensing circuit 130 is connected to the lower array side of the 2D memory array 111 to respectively receive output currents I1-I3 from the memory cells G31-G33.

Operationally, when the input voltages V1-V3 are inputted to the 2D memory array 111, the 2D memory array 111 will generate a part of the output current I1 according to the input voltage V1 and the impedance on the path of the memory cells G11, G21 and G31, generate another part of the output current I1 according to the input voltage V2 and the impedance on the path of the memory cells G21 and G31, and generate yet another part of the output current I1 according to the input voltage V3 and the impedance on the path of the memory cell G31, wherein the sum of these three parts is the output current I1. Similarly, the 2D memory array 111 will generate a part of the output current I2 according to the input voltage V1 and the impedance on the path of the memory cells G11, G12, G22 and G32, generate another part of the output current I2 according to the input voltage V2 and the impedance on the path of the memory cells G21, G22 and G32, and generate yet another part of the output current I2 according to the input voltage V3 and the impedance on the path of the memory cells G31-G32, wherein the sum of these three parts is the output current I2, and so on.

However, since each of the encoding circuit 120 and the sensing circuit 130 is only connected to respective one of the array sides of the 2D memory array 111, the magnitudes of the output currents I1-I3 are only related to the impedance from the input nodes of the input voltages V1-V3 to the output nodes of the output currents I1-I3. In other words, when the input voltages V1-V3 are input to the 2D memory array 111 from other directions, due to different current paths, the output currents I1-I3 output by the 2D memory array 111 may change, resulting in inaccurate in-memory-computing.

Figure 3:
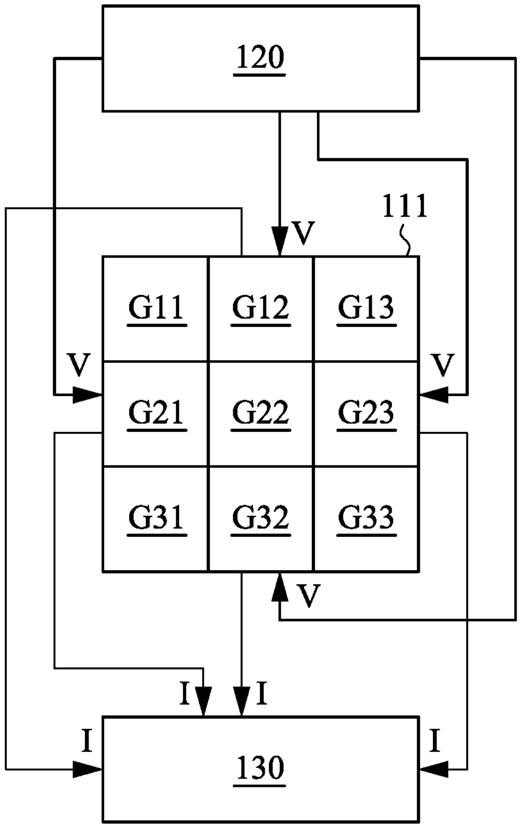
FIG. 3 is a schematic diagram of the connection relationship between a 2D memory array and its peripheral circuits in accordance with some embodiments of the present disclosure.

In order to alleviate the above problem, various embodiments are disclosed in present disclosure. FIG. 3 is a schematic diagram of the connection relationship between the 2D memory array 111 and its peripheral circuits in accordance with some embodiments of the present disclosure. For the sake of brevity of the diagram, the input voltages V1-V3 input to the array side are collectively referred to as the input voltages V, and the output currents I1-I3 output from the array side are collectively referred to as the output currents I.

In the embodiment of FIG. 3, the encoding circuit 120 is coupled to the four-array-side edge of the 2D memory array 111, and the sensing circuit 130 is also coupled to the four-array-side edge of the 2D memory array 111. The 2D memory array 111 may receive the input voltages V from the encoding circuit 120 through one of the plurality of array sides of the four-array-side edge, and output the output currents I to the sensing circuit 130 through another of the plurality of array sides of the four-array-side edge.

It should be noted that in order to make currents flow through the memory cells in the 2D memory array 111, the array side receiving the input voltages V is not parallel to the array side transmitting the output currents I. For example, when the input voltages V are input through the left array side of the 2D memory array 111, the output currents I may be output through the upper array side or lower array side of the 2D memory array 111. Therefore, the sensing circuit 130 can obtain the output currents I under different current paths, which make the processing circuit 140 able to calculate a more objective in-memory-computing result based on the data of the plurality of input voltages V and the plurality of output currents I (e.g., by calculating the mean, median or using other statistical methods).

In addition, the encoding circuit 120 and the sensing circuit 130 of the present disclosure can be implemented with a plurality of sub-circuits to simplify the routing in the 3D memory array 110. Please refer to FIGS. 4-7. FIGS. 4-7 are schematic diagrams of the connection relationships between the 2D memory array 111 and its peripheral circuits according to various embodiments of the present disclosure.

Figure 4:
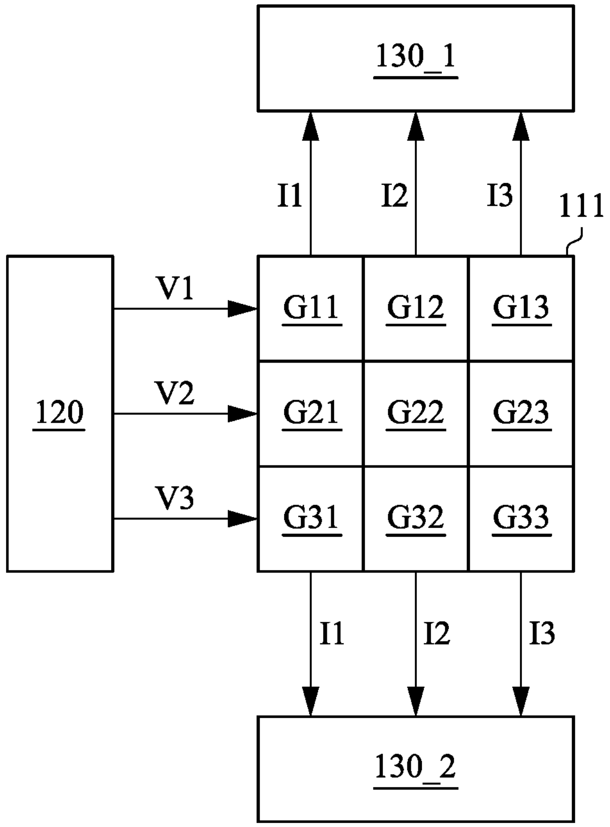
FIG. 4 is a schematic diagram of the connection relationship between a 2D memory array and its peripheral circuits in accordance with some embodiments of the present disclosure.

In the embodiment of FIG. 4, the sensing circuit 130 comprises sub-sensing circuits 130_1 and 130_2. The sub-sensing circuits 130_1 and 130_2 are respectively arranged on two opposite sides of the 2D memory array 111 and are respectively connected to two different array sides parallel to each other. Operationally, when the encoding circuit 120 inputs the input voltages V1-V3 to the left array side of the 2D memory array 111, the sub-sensing circuit 130_1 can receive the output currents I1-I3 from the upper array side of the 2D memory array 111, and the sub-sensing circuit 130_2 can receive the output currents I1-I3 from the lower array side of the 2D memory array 111. Therefore, the processing circuit 140 can obtain output current data of at least two different current paths.

Figure 5:
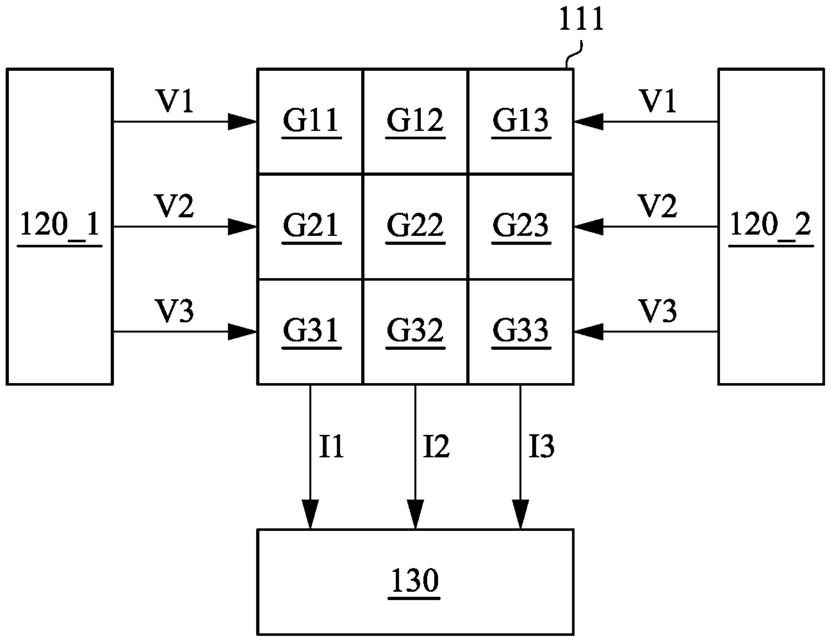
FIG. 5 is a schematic diagram of the connection relationship between a 2D memory array and its peripheral circuits in accordance with some embodiments of the present disclosure.

In the embodiment of FIG. 5, the encoding circuit 120 comprises sub-encoding circuits 120_1 and 120_2. The sub-encoding circuits 120_1 and 120_2 are respectively arranged on two opposite sides of the 2D memory array 111 and are respectively connected to two different array sides parallel to each other. Operationally, the sub-encoding circuit 120_1 can input the input voltages V1-V3 to the left array side of the 2D memory array 111, and the sub-encoding circuit 120_2 can input the input voltages V1-V3 to the right array side of the 2D memory array 111. At this time, the sensing circuit 130 will receive the output currents I1-I3 from the lower array side of the 2D memory array 111. Therefore, the processing circuit 140 can obtain output current data of at least two different current paths.

Figure 6A:
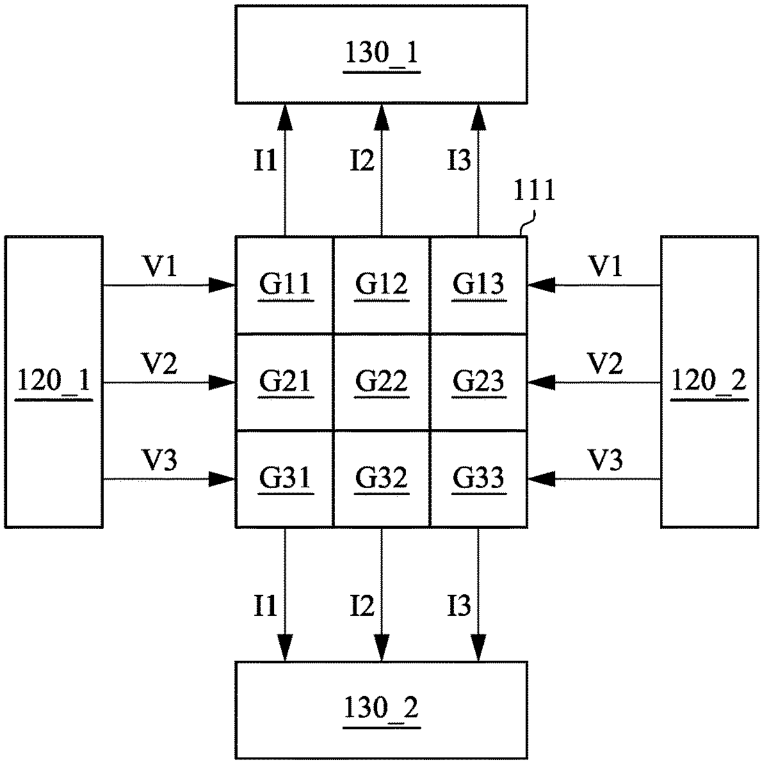
FIG. 6A is a schematic diagram of the connection relationship between a 2D memory array and its peripheral circuits in accordance with some embodiments of the present disclosure.

In the embodiment of FIG. 6A, the encoding circuit 120 comprises sub-encoding circuits 120_1 and 120_2, and the sensing circuit 130 comprises sub-sensing circuits 130_1 and 130_2. The sub-encoding circuits 120_1 and 120_2 are respectively arranged on two opposite sides of the 2D memory array 111 and are respectively connected to two different array sides parallel to each other. The sub-sensing circuits 130_1 and 130_2 are respectively arranged on the other two opposite sides of the 2D memory array 111 and are respectively connected to the other two different array sides parallel to each other. Operationally, the sub-encoding circuit 120_1 can input the input voltages V1-V3 to the left array side of the 2D memory array 111, and the sub-encoding circuit 120_2 can input the input voltages V1-V3 to the right array side of the 2D memory array 111. At this time, the sub-sensing circuit 130_1 can receive the output currents I1-I3 from the upper array side of the 2D memory array 111, and the sub-sensing circuit 130_2 can receive the output currents I1-I3 from the lower array side of the 2D memory array 111. Therefore, the processing circuit 140 can obtain output current data of at least four different current paths.

Figure 6B:
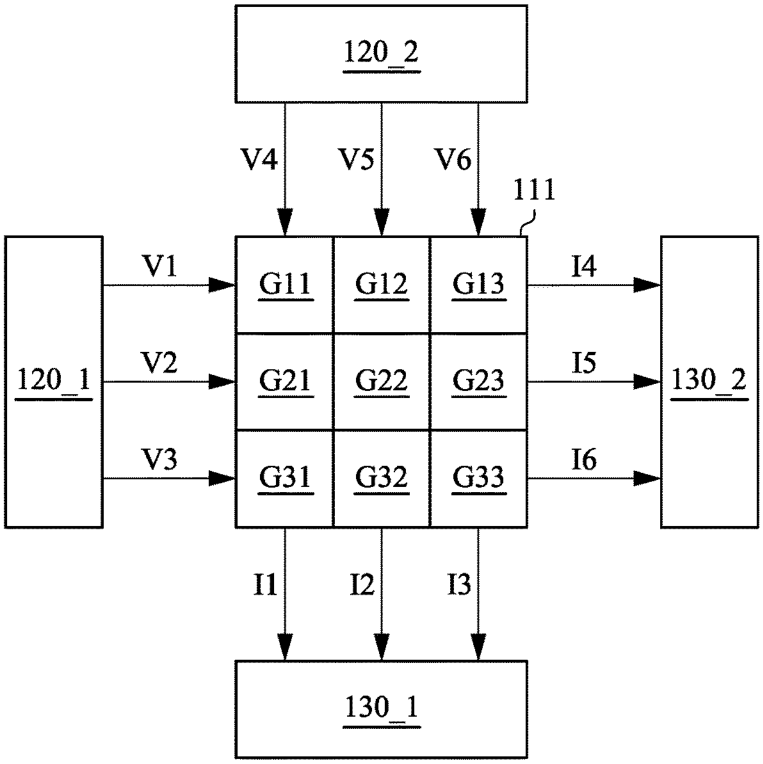
FIG. 6B is a schematic diagram of the connection relationship between a 2D memory array and its peripheral circuits in accordance with some embodiments of the present disclosure.

The embodiment of FIG. 6B is similar to the embodiment of FIG. 6A. The difference is that the sub-encoding circuits 120_1 and 120_2 are respectively arranged on two adjacent sides of the 2D memory array 111 and are respectively connected to two adjacent (i.e., non-parallel) array sides. In addition, the sub-sensing circuits 130_1 and 130_2 are respectively arranged on the other two adjacent sides of the 2D memory array 111, and are respectively connected to the other two adjacent (i.e., non-parallel) array sides. Operationally, the sub-encoding circuit 120_1 can input the input voltages V1-V3 to the left array side of the 2D memory array 111, and the sub-encoding circuit 120_2 can input the input voltages V4-V6 to the upper array side of the 2D memory array 111. At this time, the sub-sensing circuit 130_1 can receive the output currents I1-I3 from the lower array side of the 2D memory array 111, and the sub-sensing circuit 130_2 can receive the output currents I4-I6 from the right array side of the 2D memory array 111. Therefore, the processing circuit 140 can obtain output current data of at least four different current paths.

It is worth noting that when the sub-encoding circuits 120_1 and 120_2 input the input voltages V to the non-opposite (i.e., adjacent) array sides of the 2D memory array 111, since the input terminals of the input voltages are a column and a row of the array respectively, the equivalent impedance of the current paths will also be different, thus when the sub-encoding circuits 120_1 and 120_2 input the input voltages V to the 2D memory array 111, the input voltages V input by the two sub-encoding circuits will be different (e.g., the input voltages V1-V3 and the input voltages V4-V6 of FIG. 6B).

Figure 7:
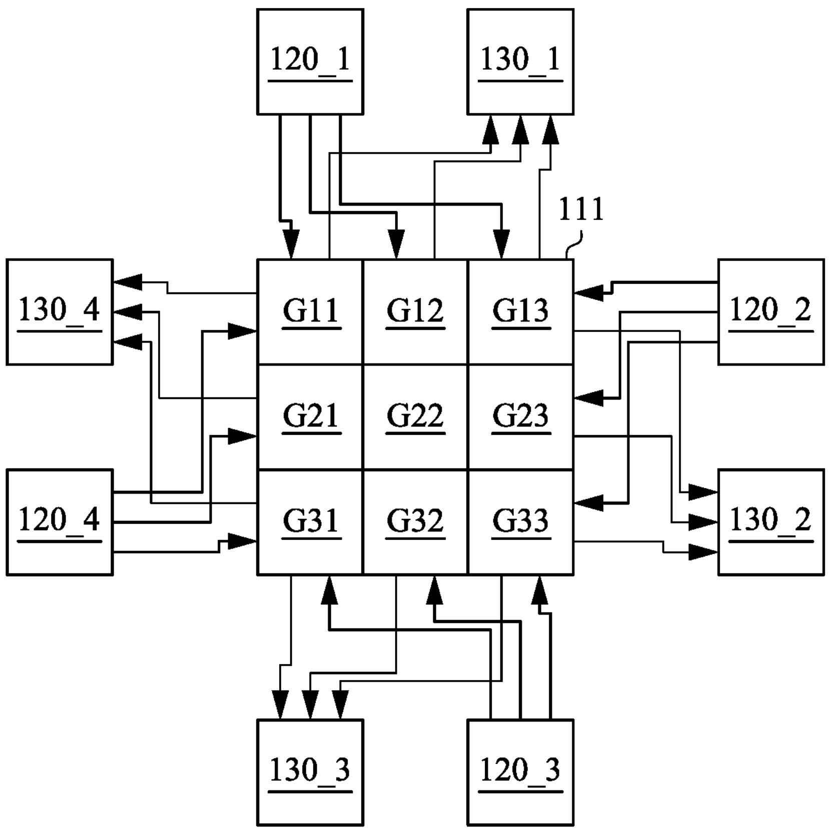
FIG. 7 is a schematic diagram of the connection relationship between a 2D memory array and its peripheral circuits in accordance with some embodiments of the present disclosure.

In the embodiment of FIG. 7, the encoding circuit 120 comprises sub-encoding circuits 120_1-120_4, and the sensing circuit 130 comprises sub-sensing circuits 130_1-130_4. The sub-encoding circuits 120_1-120_4 are respectively arranged on four sides of the 2D memory array 111, and are respectively connected to the four array sides of the 2D memory array 111. The sub-sensing circuits 130_1-130_4 are also respectively arranged on the four sides of the 2D memory array 111, and are respectively connected to the four array sides of the 2D memory array 111. It should be noted that for the sake of brevity of the diagram, the arrow symbols leading to the memory cells G11-G13, G21-G23 and G31-G33 in FIG. 7 are the input voltages V, and the arrow symbols leaving from the memory cells G11-G13, G21-G23 and G31-G33 are the output currents I, thus the labels of the input voltages V and the output currents I are omitted in FIG. 7.

Operationally, one of the sub-encoding circuits 120_1-120_4 can input the input voltages V to one of the array sides of the 2D memory array 111, and one of the sub-sensing circuits 130_1-130_4 can receive the output currents I from another non-opposite (i.e., adjacent) array side at this time. Therefore, the processing circuit 140 can obtain output current data of at least eight different current paths. In addition, since each side of the 2D memory array 111 is arranged with a sub-encoding circuit and a sub-sensing circuit, the data obtained by the processing circuit 140 can be increased (i.e., improving the accuracy of in-memory-computing), and the routing in the 3D memory array 110 can be better simplified.

Figure 8:
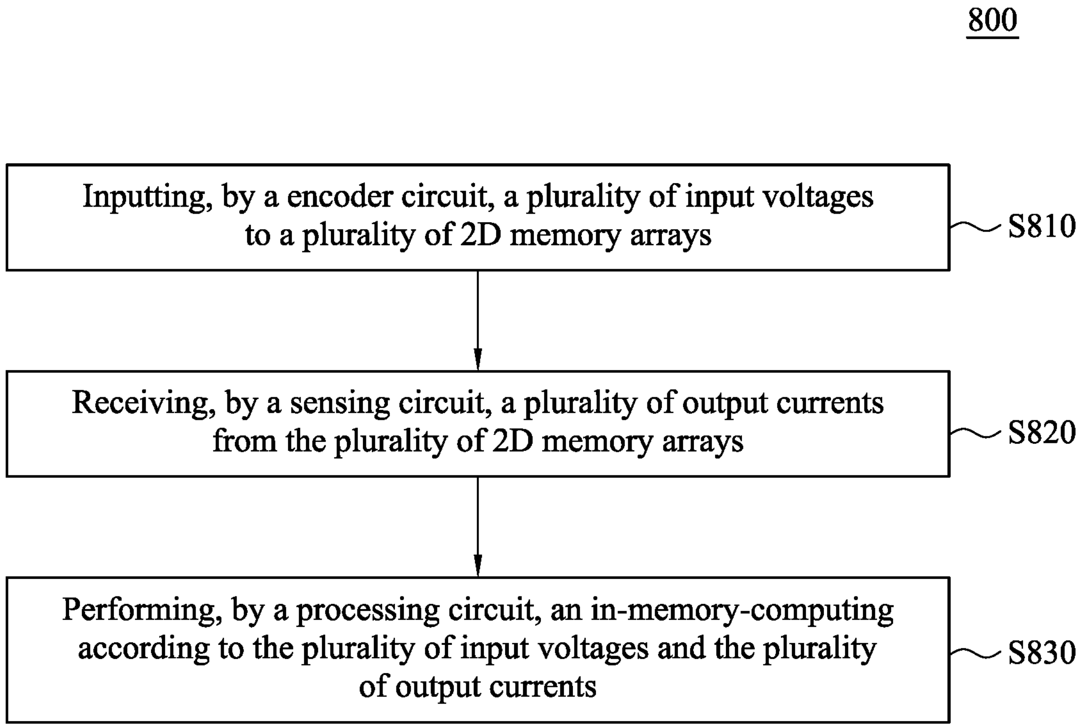
FIG. 8 is a flowchart of a computing method in accordance with some embodiments of the present disclosure.

FIG. 8 is a flowchart of a computing method 800 in accordance with some embodiments of the present disclosure. In some embodiments, the computing method 800 is suitable for a 3D memory device comprising a 3D memory array, an encoding circuit, a sensing circuit and a processing circuit, and the computing method 800 comprises steps S810, S820 and S830.

In step S810, a plurality of input voltages are input to a plurality of 2D memory arrays in the 3D memory array by an encoding circuit. In some embodiments, step S810 further comprises: inputting the plurality of input voltages to the 2D memory array through a plurality of array sides of the 2D memory array by a plurality of sub-encoding circuits of the encoding circuit. Next, step S820 will be performed.

In step S820, a plurality of output currents from the plurality of 2D memory arrays are received by a sensing circuit. In some embodiments, step S820 further comprises: receiving the plurality output currents from the plurality of array sides of the 2D memory array by a plurality of sub-sensing circuits of the sensing circuit. Next, step S830 will be performed.

In step S830, an in-memory-computing is performed by a processing circuit based on the plurality of input voltages and the plurality of output currents. In some embodiments, the in-memory-computing based on the plurality of input voltages and the plurality of output currents may be performed by calculating an average, a median or using other statistical methods.

It should be noted that the number and order of steps in the computing method 800 of the present disclosure are only examples, and are not intended to limit the present disclosure. Other numbers and orders of steps are within the scope of the present disclosure. In some embodiments, the computing method 800 further comprises step S840 performed after step S830. In step S840, the sub-encoding circuit that generates the input voltages is switched by the processing circuit, the sub-sensing circuit that receives the output currents is switched by the processing circuit, and step S810 will performed again.

With the 3D memory device 100 and the computing method 800 of the present disclosure, a plurality of input voltages and a plurality of output currents corresponding to different current paths can be used to perform in-memory-computing without greatly complicating the routing of the 3D memory device 100, which alleviates the problem of inaccuracy in the in-memory-computing caused by voltage drops on the wires inside the memory array.

The above are preferred embodiments of the present disclosure. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A three-dimensional (3D) memory device, comprising:

a 3D memory array, comprising a plurality of two-dimensional (2D) memory arrays, and configured to receive a plurality of input voltages and output a plurality of output currents, wherein each of the plurality of 2D memory arrays has a plurality of array sides;

an encoding circuit, coupled to the plurality of array sides and configured to input the plurality of input voltages to the plurality of 2D memory arrays;

a sensing circuit, coupled to the plurality of array sides and configured to receive the plurality of output currents from the plurality of 2D memory arrays; and a processing circuit, coupled to the encoding circuit and the sensing circuit, and configured to perform an in-memory-computing according to the plurality of input voltages and the plurality of output currents, wherein in the in-memory-computing, the processing circuit is configured to calculate a plurality of path-dependent currents respectively corresponding to a plurality of path configurations, wherein each of the plurality of path configurations is related to one of the plurality of array sides where the plurality of input voltages enter and another of the plurality of array sides where the plurality of output currents exit, wherein when one of the plurality of array sides in one of the plurality of 2D memory arrays is configured to receive the plurality of input voltages, another of the plurality of array sides in the one of the plurality of 2D memory arrays is configured to output the plurality of output currents, and the one of the plurality of array sides is not parallel to the another of the plurality of array sides.

2. The 3D memory device of claim 1, wherein the encoding circuit comprises a first encoding circuit and a second encoding circuit, wherein the first encoding circuit and the second encoding circuit are configured to input the plurality of input voltages to the plurality of 2D memory arrays respectively through a first array side and a second array side of the plurality of array sides, wherein the first array side is parallel to and different from the second array side.

3. The 3D memory device of claim 1, wherein the sensing circuit comprises a first sensing circuit and a second sensing circuit, wherein the first sensing circuit and the second sensing circuit are configured to receive the plurality of output currents from the plurality of 2D memory arrays respectively through a first array side and a second array side of the plurality of array sides, wherein the first array side is parallel to and different from the second array side.

4. The 3D memory device of claim 1, wherein the encoding circuit comprises a first encoding circuit and a second encoding circuit, and the sensing circuit comprises a first sensing circuit and a second sensing circuit, wherein the first encoding circuit and the second encoding circuit are configured to input the plurality of input voltages to the plurality of 2D memory arrays respectively through a first array side and a second array side of the plurality of array sides, and the first sensing circuit and the second sensing circuit are configured to receive the plurality of output currents from the plurality of 2D memory arrays respectively through a third array side and a fourth array side of the plurality of array sides, wherein the first array side is parallel to and different from the second array side, and the third array side is parallel to and different from the fourth array side.

5. The 3D memory device of claim 1, wherein the encoding circuit comprises a first encoding circuit and a second encoding circuit, and the sensing circuit comprises a first sensing circuit and a second sensing circuit, wherein the first encoding circuit is configured to input a plurality of first input voltages to the plurality of 2D memory arrays through a first array side of the plurality of array sides, and the second encoding circuit is configured to input a plurality of second input voltages to the plurality of 2D memory arrays through a second array side of the plurality of array sides, and the first sensing circuit is configured to receive a plurality of first output currents from the plurality of 2D memory arrays through a third array side of the plurality of array sides, and the second sensing circuit is configured to receive a plurality of second output currents from the plurality of 2D memory arrays through a fourth array side of the plurality of array sides, wherein the first array side is not parallel to the second array side, the third array side is not parallel to the fourth array side, and the plurality of first input voltages are different from the plurality of second input voltages.

6. The 3D memory device of claim 1, wherein the encoding circuit comprises four sub-encoding circuits, and the sensing circuit comprises four sub-sensing circuits, wherein the four sub-encoding circuits are respectively coupled to the plurality of array sides of the each of the plurality of 2D memory arrays, and the four sub-sensing circuits are respectively coupled to the plurality of array sides of the each of the plurality of 2D memory arrays, wherein when one of the four sub-encoding circuits inputs the plurality of input voltages to the plurality of 2D memory arrays, one of the four sub-sensing circuits is configured to receive the plurality of output currents from the plurality of 2D memory arrays, wherein the array side that the one of the four sub-encoding circuits is coupled to is not parallel to the array side that the one of the four sub-sensing circuits is coupled to.

7. The 3D memory device of claim 6, wherein the processing circuit is further configured to control the one of the four sub-encoding circuits and the one of the four sub-sensing circuits to conduct to the 3D memory array, and control the other three of the four sub-encoding circuits and the other three of the four sub-sensing circuits to electrically disconnect from the 3D memory array.

8. A computing circuit, coupled to a 3D memory array comprising a plurality of 2D memory arrays, and each of the plurality of 2D memory arrays has a plurality of array sides, wherein the computing circuit comprises:

an encoding circuit, coupled to the plurality of array sides and configured to input a plurality of input voltages to the plurality of 2D memory arrays;

a sensing circuit, coupled to the plurality of array sides and configured to receive a plurality of output currents from the plurality of 2D memory arrays; and a processing circuit, coupled to the encoding circuit and the sensing circuit, and configured to perform an in-memory-computing according to the plurality of input voltages and the plurality of output currents, wherein in the in-memory-computing, the processing circuit is configured to calculate a plurality of path-dependent currents respectively corresponding to a plurality of path configurations, wherein each of the plurality of path configurations is related to one of the plurality of array sides where the plurality of input voltages enter and another of the plurality of array sides where the plurality of output currents exit, wherein when the encoding circuit inputs the plurality of input voltages to one of the plurality of array sides in one of the plurality of 2D memory arrays, the sensing circuit receives the plurality of output currents from another of the plurality of array sides in the one of the plurality of 2D memory arrays, and the one of the plurality of array sides is not parallel to the another of the plurality of array sides.

9. The computing circuit of claim 8, wherein the encoding circuit comprises a first encoding circuit and a second encoding circuit, wherein the first encoding circuit and the second encoding circuit are configured to input the plurality of input voltages to the plurality of 2D memory arrays respectively through a first array side and a second array side of the plurality of array sides, wherein the first array side is parallel to and different from the second array side.

10. The computing circuit of claim 8, wherein the sensing circuit comprises a first sensing circuit and a second sensing circuit, wherein the first sensing circuit and the second sensing circuit are configured to receive the plurality of output currents from the plurality of 2D memory arrays respectively through a first array side and a second array side of the plurality of array sides, wherein the first array side is parallel to and different from the second array side.

11. The computing circuit of claim 8, wherein the encoding circuit comprises a first encoding circuit and a second encoding circuit, and the sensing circuit comprises a first sensing circuit and a second sensing circuit, wherein the first encoding circuit and the second encoding circuit are configured to input the plurality of input voltages to the plurality of 2D memory arrays respectively through a first array side and a second array side of the plurality of array sides, and the first sensing circuit and the second sensing circuit are configured to receive the plurality of output currents from the plurality of 2D memory arrays respectively through a third array side and a fourth array side of the plurality of array sides, wherein the first array side is parallel to and different from the second array side, and the third array side is parallel to and different from the fourth array side.

12. The computing circuit of claim 8, wherein the encoding circuit comprises a first encoding circuit and a second encoding circuit, and the sensing circuit comprises a first sensing circuit and a second sensing circuit, wherein the first encoding circuit is configured to input a plurality of first input voltages to the plurality of 2D memory arrays through a first array side of the plurality of array sides, and the second encoding circuit is configured to input a plurality of second input voltages to the plurality of 2D memory arrays through a second array side of the plurality of array sides, and the first sensing circuit is configured to receive a plurality of first output currents from the plurality of 2D memory arrays through a third array side of the plurality of array sides, and the second sensing circuit is configured to receive a plurality of second output currents from the plurality of 2D memory arrays through a fourth array side of the plurality of array sides, wherein the first array side is not parallel to the second array side, the third array side is not parallel to the fourth array side, and the plurality of first input voltages are different from the plurality of second input voltages.

13. The computing circuit of claim 8, wherein the encoding circuit comprises four sub-encoding circuits, and the sensing circuit comprises four sub-sensing circuits, wherein the four sub-encoding circuits are respectively coupled to the plurality of array sides of the each of the plurality of 2D memory arrays, and the four sub-sensing circuits are respectively coupled to the plurality of array sides of the each of the plurality of 2D memory arrays, wherein when one of the four sub-encoding circuits inputs the plurality of input voltages to the plurality of 2D memory arrays, one of the four sub-sensing circuits is configured to receive the plurality of output currents from the plurality of 2D memory arrays, wherein the array side that the one of the four sub-encoding circuits is coupled to is not parallel to the array side that the one of the four sub-sensing circuits is coupled to.

14. The computing circuit of claim 13, wherein the processing circuit is further configured to control the one of the four sub-encoding circuits and the one of the four sub-sensing circuits to conduct to the 3D memory array, and control the other three of the four sub-encoding circuits and the other three of the four sub-sensing circuits to electrically disconnect from the 3D memory array.

15. A computing method, suitable for a 3D memory device comprising a 3D memory array, an encoding circuit, a sensing circuit and a processing circuit, and the 3D memory array comprises a plurality of 2D memory arrays, wherein the computing method comprises:

inputting, by the encoding circuit, a plurality of input voltages to the plurality of 2D memory arrays;

receiving, by the sensing circuit, a plurality of output currents from the plurality of 2D memory arrays; and performing, by the processing circuit, an in-memory-computing according to the plurality of input voltages and the plurality of output currents, comprising:

calculating, by the processing circuit, a plurality of path-dependent currents respectively corresponding to a plurality of path configurations, wherein each of the plurality of 2D memory arrays has a plurality of array sides, wherein each of the plurality of path configurations is related to one of the plurality of array sides where the plurality of input voltages enter and another of the plurality of array sides where the plurality of output currents exit, and wherein when one of the plurality of array sides in one of the plurality of 2D memory arrays is configured to receive the plurality of input voltages, another of the plurality of array sides in the one of the plurality of 2D memory arrays is configured to output the plurality of output currents, and the one of the plurality of array sides is not parallel to the another of the plurality of array sides.

16. The computing method of claim 15, wherein inputting, by the encoding circuit, the plurality of input voltages to the plurality of 2D memory arrays comprises:

inputting, by a first encoding circuit of the encoding circuit, the plurality of input voltages to the plurality of 2D memory arrays through a first array side of the plurality of array sides; and inputting, by a second encoding circuit of the encoding circuit, the plurality of input voltages to the plurality of 2D memory arrays through a second array side of the plurality of array sides, wherein the first array side is parallel to and different from the second array side.

17. The computing method of claim 15, wherein receiving, by the sensing circuit, the plurality of output currents from the plurality of 2D memory arrays comprises:

receiving, by a first sensing circuit of the sensing circuit, the plurality of output currents from the plurality of 2D memory arrays through a first array side of the plurality of array sides; and receiving, by a second sensing circuit of the sensing circuit, the plurality of output currents from the plurality of 2D memory arrays through a second array side of the plurality of array sides, wherein the first array side is parallel to and different from the second array side.

18. The computing method of claim 15, wherein inputting, by the encoding circuit, the plurality of input voltages to the plurality of 2D memory arrays comprises:

inputting, by a first encoding circuit of the encoding circuit, the plurality of input voltages to the plurality of 2D memory arrays through a first array side of the plurality of array sides; and inputting, by a second encoding circuit of the encoding circuit, the plurality of input voltages to the plurality of 2D memory arrays through a second array side of the plurality of array sides, and wherein receiving, by the sensing circuit, the plurality of output currents from the plurality of 2D memory arrays comprises:

receiving, by a first sensing circuit of the sensing circuit, the plurality of output currents from the plurality of 2D memory arrays through a third array side of the plurality of array sides; and receiving, by a second sensing circuit of the sensing circuit, the plurality of output currents from the plurality of 2D memory arrays through a fourth array side of the plurality of array sides, wherein the first array side is parallel to and different from the second array side, and the third array side is parallel to and different from the fourth array side.

19. The computing method of claim 15, wherein inputting, by the encoding circuit, the plurality of input voltages to the plurality of 2D memory arrays comprises:

inputting, by a first encoding circuit of the encoding circuit, a plurality of first input voltages to the plurality of 2D memory arrays through a first array side of the plurality of array sides; and inputting, by a second encoding circuit of the encoding circuit, a plurality of second input voltages to the plurality of 2D memory arrays through a second array side of the plurality of array sides, and wherein receiving, by the sensing circuit, the plurality of output currents from the plurality of 2D memory arrays comprises:

receiving, by a first sensing circuit of the sensing circuit, a plurality of first output currents from the plurality of 2D memory arrays through a third array side of the plurality of array sides; and receiving, by a second sensing circuit of the sensing circuit, a plurality of second output currents from the plurality of 2D memory arrays through a fourth array side of the plurality of array sides, wherein the first array side is not parallel to the second array side, the third array side is not parallel to the fourth array side, and the plurality of first input voltages are different from the plurality of second input voltages.

20. The computing method of claim 15, wherein the encoding circuit comprises four sub-encoding circuits respectively coupled to the plurality of array sides of the each of the plurality of 2D memory arrays, and the sensing circuit comprises four sub-sensing circuits respectively coupled to the plurality of array sides of the each of the plurality of 2D memory arrays, wherein inputting, by the encoding circuit, the plurality of input voltages to the plurality of 2D memory arrays comprises:

inputting, by one of the four sub-encoding circuits, the plurality of input voltages to the plurality of 2D memory arrays, and wherein receiving, by the sensing circuit, the plurality of output currents from the plurality of 2D memory arrays comprises:

receiving, by one of the four sub-sensing circuits, the plurality of output currents from the plurality of 2D memory arrays, wherein the array side that the one of the four sub-encoding circuits is coupled to is not parallel to the array side that the one of the four sub-sensing circuits is coupled to.

* * * * *